United States Patent
Takamine

(10) Patent No.: US 7,532,090 B2
(45) Date of Patent: May 12, 2009

(54) ACOUSTIC WAVE FILTER DEVICE AND DUPLEXER

(75) Inventor: Yuichi Takamine, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 196 days.

(21) Appl. No.: 11/763,906

(22) Filed: Jun. 15, 2007

(65) Prior Publication Data

US 2007/0236308 A1 Oct. 11, 2007

Related U.S. Application Data

(63) Continuation of application No. PCT/JP2006/318629, filed on Sep. 20, 2006.

(30) Foreign Application Priority Data

Oct. 3, 2005 (JP) ............... 2005-290243

(51) Int. Cl.
*H03H 9/145* (2006.01)
*H03H 9/64* (2006.01)
*H03H 9/72* (2006.01)

(52) U.S. Cl. .................. 333/133; 333/196; 310/313 C

(58) Field of Classification Search ......... 333/195–196; 310/313 B, 313 C, 313 D
See application file for complete search history.

(56) References Cited

U.S. PATENT DOCUMENTS

| 6,556,100 | B2 * | 4/2003 | Takamine ............... 333/133 |
| 6,621,380 | B2 | 9/2003 | Takamine |
| 6,815,868 | B2 | 11/2004 | Shibata et al. |
| 6,815,870 | B2 | 11/2004 | Shibata et al. |
| 6,853,270 | B2 * | 2/2005 | Shibahara ............... 333/195 |
| 2002/0145361 | A1 | 10/2002 | Shibata et al. |
| 2003/0169129 | A1 | 9/2003 | Takamine |
| 2005/0001699 | A1 * | 1/2005 | Takamine ............... 333/195 |
| 2007/0126531 | A1 * | 6/2007 | Yata ............... 333/195 |
| 2008/0266027 | A1 * | 10/2008 | Yata ............... 333/195 |

FOREIGN PATENT DOCUMENTS

| JP | 07-030364 A | 1/1995 |
| JP | 07-131281 A | 5/1995 |
| JP | 08-181566 A | 7/1996 |
| JP | 09-214281 A | 8/1997 |
| JP | 10-135780 A | 5/1998 |
| JP | 2002-084163 A | 3/2002 |
| JP | 2003-179458 A | 6/2003 |
| JP | 2003-289234 A | 10/2003 |
| JP | 2003-289238 A | 10/2003 |
| JP | 2003-318700 A | 11/2003 |

OTHER PUBLICATIONS

Official Communication for PCT Application No. PCT/JP2006/318629; mailed on Dec. 26, 2006.

* cited by examiner

*Primary Examiner*—Barbara Summons
(74) *Attorney, Agent, or Firm*—Keating & Bennett, LLP

(57) ABSTRACT

In an acoustic wave filter device, first and second longitudinally coupled resonator SAW filters are provided on a piezoelectric substrate. The first and second longitudinally coupled resonator SAW filters are connected in parallel to each other. The first and second longitudinally coupled resonator SAW filters are withdrawal-weighted. The withdrawal weighting in at least the longitudinally coupled resonator SAW filter is different from the withdrawal weighting in the other longitudinally coupled resonator SAW filter.

24 Claims, 6 Drawing Sheets

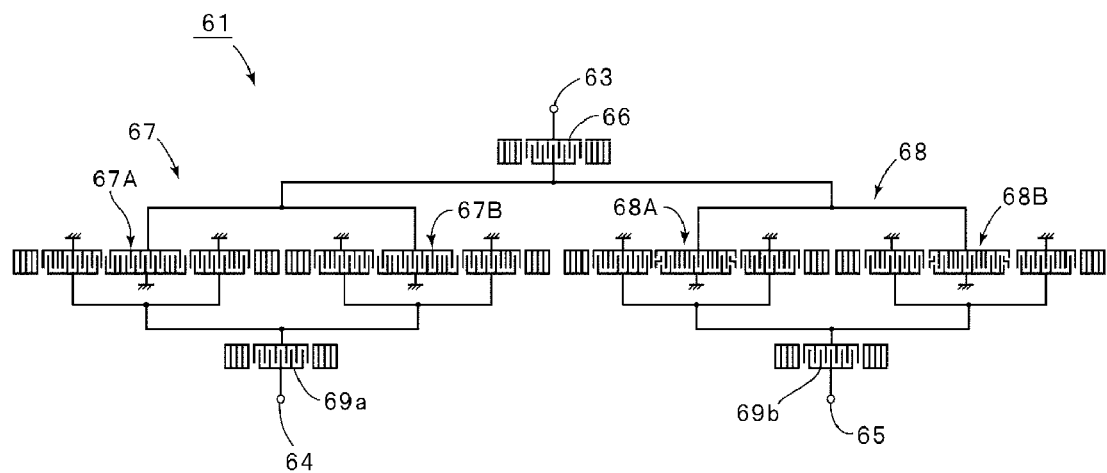
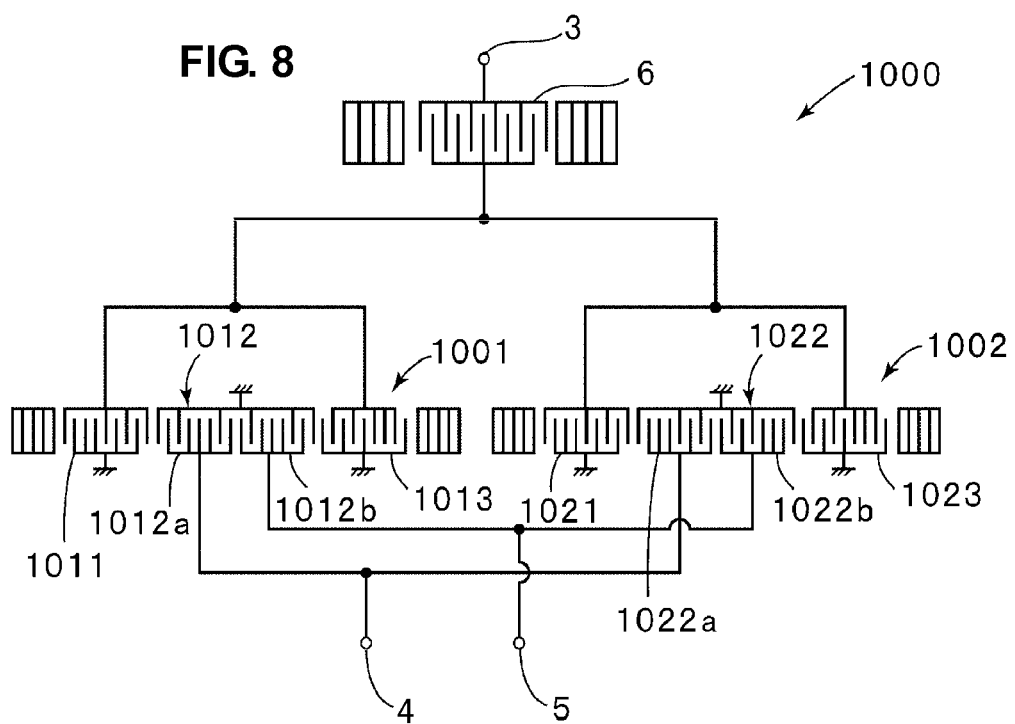

FIG. 11
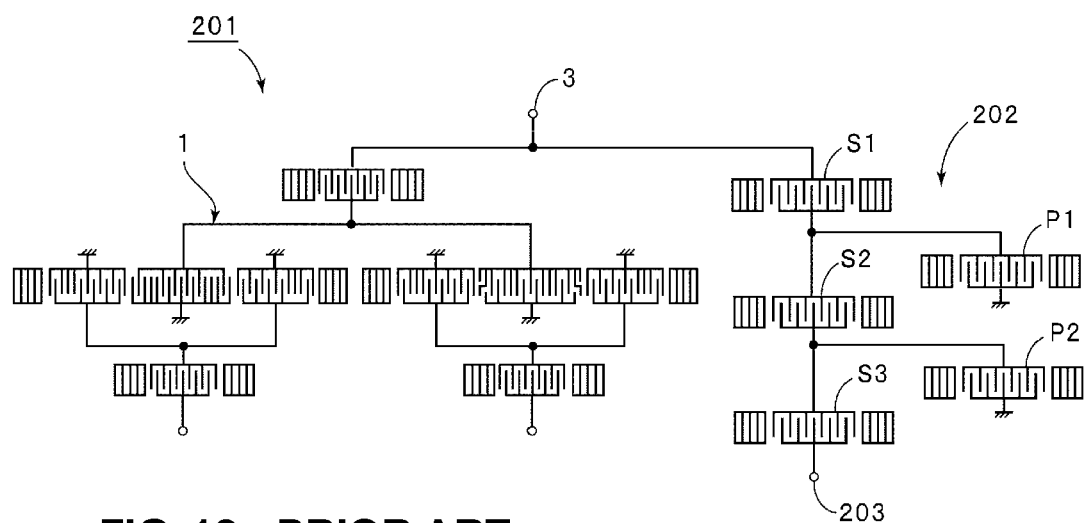
FIG. 12 - PRIOR ART
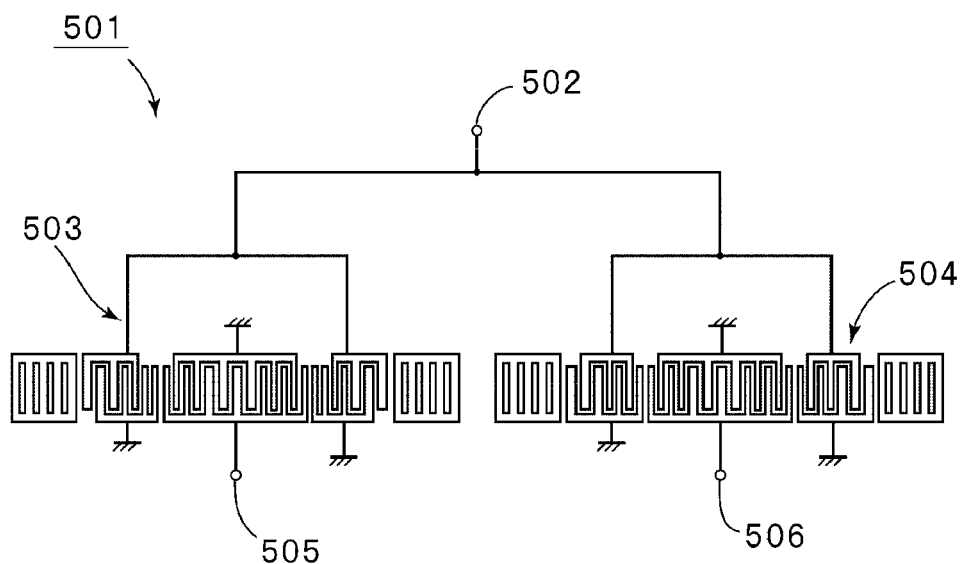

ACOUSTIC WAVE FILTER DEVICE AND DUPLEXER

BACKGROUND OF THE INVENTION

1. Field of the Invention

The present invention relates to an acoustic wave filter device using surface acoustic waves or boundary acoustic waves and a duplexer. More specifically, the present invention relates to an acoustic wave filter device having a configuration in which interdigital transducers (IDTs) are withdrawal-weighted and a duplexer.

2. Description of the Related Art

Conventionally, various types of surface acoustic wave (SAW) filter devices have been used as bandpass filters of mobile communication apparatuses. The SAW filter devices include a plurality of longitudinally coupled resonator SAW filters connected in parallel.

For example, Japanese Unexamined Patent Application Publication No. 8-181566 (Patent Document 1) discloses a configuration in which first and second longitudinally coupled resonator SAW filter units are connected in parallel to an input terminal. Each of the first and second longitudinally coupled resonator SAW filter units is formed by cascading two longitudinally coupled resonator SAW filters having the same design in two stages.

In the acoustic wave filter device described in Patent Document 1, the crossing width of electrode fingers is half of that in a case where one longitudinally coupled resonator acoustic wave filter is used, and the two longitudinally coupled resonator acoustic wave filter units are connected in parallel to the input terminal. With this configuration, the resistance of the electrode fingers can be reduced to a quarter and the insertion loss of the acoustic wave filter device can be reduced.

On the other hand, Japanese Unexamined Patent Application Publication No. 2003-318700 (Patent Document 2) discloses a longitudinally coupled resonator SAW filter device having the electrode configuration shown in FIG. 12. As shown in FIG. 12, the longitudinally coupled resonator SAW filter device 501 described in Patent Document 2 includes first and second longitudinally coupled resonator SAW filters 503 and 504 connected in parallel to an input terminal 502. The longitudinally coupled resonator SAW filters 503 and 504 are connected to first and second balanced signal terminals 505 and 506, respectively.

Among the parallel-connected longitudinally coupled resonator SAW filters 503 and 504, the longitudinally coupled resonator SAW filter 503 is withdrawal-weighted. The other longitudinally coupled resonator SAW filter 504 is not withdrawal-weighted.

By withdrawal-weighting a plurality of IDTs of the longitudinally coupled resonator SAW filter 503, the degree of balance in a signal between the first and second balanced signal terminals 505 and 506 is improved.

In the longitudinally coupled resonator SAW filter device described in Patent Document 1, insertion loss can be reduced. However, it is difficult to obtain a sufficient attenuation in an attenuation band near a passband.

Also, in the longitudinally coupled resonator SAW filters described in Patent Document 2, an attenuation in an attenuation band near a passband is insufficient, although the degree of balance is improved by withdrawal weighting performed on the longitudinally coupled resonator SAW filter 503, as described above.

SUMMARY OF THE INVENTION

To overcome the problems described above, preferred embodiments of the present invention provide an acoustic wave filter device having a configuration in which a plurality of longitudinally coupled resonator acoustic wave filters are connected in parallel to each other and capable of obtaining a sufficient attenuation in an attenuation band near a passband.

According to a first preferred embodiment, an acoustic wave filter device includes a piezoelectric substrate, and a plurality of longitudinally coupled resonator acoustic wave filters provided on the piezoelectric substrate. Each of the longitudinally coupled resonator acoustic wave filters includes an input terminal, an output terminal, an IDT connected to the input terminal, and an IDT connected to the output terminal, the IDT connected to the input terminal and the IDT connected to the output terminal being alternately arranged along an acoustic wave propagating direction. The acoustic wave filter device further includes a first terminal connected to the input terminals of the plurality of longitudinally coupled resonator acoustic wave filters, and a second terminal connected to the output terminals of the plurality of longitudinally coupled resonator acoustic wave filters. The plurality of longitudinally coupled resonator acoustic wave filters are withdrawal-weighted, and the withdrawal weighting in at least one of the longitudinally coupled resonator acoustic wave filters is different from the withdrawal weighting in the other longitudinally coupled resonator acoustic wave filters.

According to a second preferred embodiment, an acoustic wave filter device includes a piezoelectric substrate, at least one first longitudinally coupled resonator acoustic wave filter, and at least one second longitudinally coupled resonator acoustic wave filter. The first longitudinally coupled resonator acoustic wave filter includes an input terminal, an output terminal, an IDT connected to the input terminal, and an IDT connected to the output terminal. On the piezoelectric substrate, the IDT connected to the input terminal and the IDT connected to the output terminal are alternately arranged along an acoustic wave propagating direction, and the output terminal or the input terminal is connected to a first balanced signal terminal. The second longitudinally coupled resonator acoustic wave filter includes an input terminal, an output terminal, an IDT connected to the input terminal, and an IDT connected to the output terminal. On the piezoelectric substrate, the IDT connected to the input terminal and the IDT connected to the output terminal are alternately arranged along the acoustic wave propagating direction, the output terminal or the input terminal is connected to a second balanced signal terminal, and the phase of the second longitudinally coupled resonator acoustic wave filter is different by 180° from the phase of the first longitudinally coupled resonator acoustic wave filter. The input terminals or the output terminals of the first and second longitudinally coupled resonator acoustic wave filters are connected to an unbalanced signal terminal. The first and second longitudinally coupled resonator acoustic wave filters are withdrawal-weighted, and the withdrawal weighting in at least one of the first and second longitudinally coupled resonator acoustic wave filters is different from the withdrawal weighting in the other longitudinally coupled resonator acoustic wave filter.

According to a third preferred embodiment, an acoustic wave filter device includes a piezoelectric substrate, and first to fourth longitudinally coupled resonator acoustic wave filters, an unbalanced signal terminal, and first and second balanced signal terminals, provided on the piezoelectric substrate. Each of the first to fourth longitudinally coupled resonator acoustic wave filters is provided on the piezoelectric substrate and includes a first IDT connected to an input terminal or an output terminal of the corresponding one of the first to fourth longitudinally coupled resonator acoustic wave filters and second IDTs provided on both sides of the first IDT in an acoustic wave propagating direction and connected to the output terminal or the input terminal. The input terminals of the first and second longitudinally coupled resonator acoustic wave filters are connected to the unbalanced signal terminal, the output terminal of the third longitudinally coupled resonator acoustic wave filter is connected to the first balanced signal terminal, and the output terminal of the fourth longitudinally coupled resonator acoustic wave filter is connected to the second balanced signal terminal. The output terminal of the first longitudinally coupled resonator acoustic wave filter is connected to the input terminal of the third longitudinally coupled resonator acoustic wave filter, and the output terminal of the second longitudinally coupled resonator acoustic wave filter is connected to the input terminal of the fourth longitudinally coupled resonator acoustic wave filter. The phase of one of the first to fourth longitudinally coupled resonator acoustic wave filters is inverted with respect to the phases of the other longitudinally coupled resonator acoustic wave filters. The first and second longitudinally coupled resonator acoustic wave filters are withdrawal-weighted, and the withdrawal weighting in the first longitudinally coupled resonator acoustic wave filter is different from the withdrawal weighting in the second longitudinally coupled resonator acoustic wave filter.

According to a fourth preferred embodiment, an acoustic wave filter device includes a piezoelectric substrate, and first to fourth longitudinally coupled resonator acoustic wave filters, an unbalanced signal terminal, and first and second balanced signal terminals, provided on the piezoelectric substrate. Each of the first to fourth longitudinally coupled resonator acoustic wave filters is provided on the piezoelectric substrate and includes a first IDT connected to an input terminal or an output terminal of the corresponding one of the first to fourth longitudinally coupled resonator acoustic wave filters and second IDTs provided on both sides of the first IDT in an acoustic wave propagating direction and connected to the output terminal or the input terminal. The input terminals of the first and second longitudinally coupled resonator acoustic wave filters are connected to the unbalanced signal terminal, the output terminal of the third longitudinally coupled resonator acoustic wave filter is connected to the first balanced signal terminal, and the output terminal of the fourth longitudinally coupled resonator acoustic wave filter is connected to the second balanced signal terminal. The output terminal of the first longitudinally coupled resonator acoustic wave filter is connected to the input terminal of the third longitudinally coupled resonator acoustic wave filter, and the output terminal of the second longitudinally coupled resonator acoustic wave filter is connected to the input terminal of the fourth longitudinally coupled resonator acoustic wave filter. The phase of one of the first to fourth longitudinally coupled resonator acoustic wave filters is inverted with respect to the phases of the other longitudinally coupled resonator acoustic wave filters. The third and fourth longitudinally coupled resonator acoustic wave filters are withdrawal-weighted, and the withdrawal weighting in the third longitudinally coupled resonator acoustic wave filter is different from the withdrawal weighting in the fourth longitudinally coupled resonator acoustic wave filter.

The withdrawal weighting may be performed in an asymmetrical manner with respect to the center of the withdrawal-weighted longitudinally coupled resonator acoustic wave filter in the acoustic wave propagating direction.

The number of electrode fingers on which the withdrawal weighting is performed may be equal among the withdrawal-weighted longitudinally coupled resonator acoustic wave filters.

The withdrawal weighting may be performed on the corresponding IDTs among the plurality of longitudinally coupled resonator acoustic wave filters.

In the acoustic wave filter device according to preferred embodiments of the present invention, all of the IDTs may be withdrawal-weighted.

A duplexer according to another preferred embodiment of the present invention includes the acoustic wave filter device configured in accordance with preferred embodiments of the present invention.

In the acoustic wave filter device according to the first preferred embodiment, the input terminals of the plurality of longitudinally coupled resonator acoustic wave filters are connected to the first terminal, the output terminals of the plurality of longitudinally coupled resonator acoustic wave filters are connected to the second terminal, and the withdrawal weighting in at least one of the longitudinally coupled resonator acoustic wave filters is different from the withdrawal weighting in the other longitudinally coupled resonator acoustic wave filters.

When the longitudinally coupled resonator acoustic wave filters are withdrawal-weighted and when different manners of withdrawal weighting are used, the frequencies of the peak and valley of response or the magnitude of response in the attenuation band near the passband can be changed without significantly affecting the filter characteristic in the passband. In the first preferred embodiment, the withdrawal weighting in at least one of the longitudinally coupled resonator acoustic wave filters is different from the withdrawal weighting in the other longitudinally coupled resonator acoustic wave filters. By adjusting the manner of the withdrawal weighting, the filter characteristic in the attenuation band near the passband can be controlled without significantly affecting the filter characteristic in the passband. For example, the attenuation in the attenuation band can be easily increased.

If the withdrawal weighting in at least one of the longitudinally coupled resonator acoustic wave filters is different from the withdrawal weighting in the other longitudinally coupled resonator acoustic wave filters so that the attenuation in the attenuation band on the lower frequency side of the passband is increased, a sufficient attenuation can be obtained in the attenuation band near the passband on the lower frequency side of the passband.

In the acoustic wave filter device according to the second preferred embodiment, at least one first longitudinally coupled resonator acoustic wave filter and at least one second longitudinally coupled resonator acoustic wave filter are connected in parallel between the input terminal and the output terminal. The phase of the second longitudinally coupled resonator acoustic wave filter is different by 180° from the phase of the first longitudinally coupled resonator acoustic wave filter. Accordingly, a longitudinally coupled resonator acoustic wave filter device having a balance-to-unbalance transforming function is provided.

In the second preferred, the withdrawal weighting in at least one of the first and second longitudinally coupled resonator acoustic wave filters is different from the withdrawal weighting in the other longitudinally coupled resonator acoustic wave filter. By adjusting the manner of the withdrawal weighting, the attenuation in the attenuation band near the passband can be adjusted without significantly affecting the filter characteristic in the passband. For example, a sufficient attenuation can be obtained in the attenuation band near the passband.

If the withdrawal weighting in at least one of the first and second longitudinally coupled resonator acoustic wave filters is different from the withdrawal weighting in the other longitudinally coupled resonator acoustic wave filter so that the attenuation in the attenuation band on the lower frequency side of the passband is increased, a sufficient attenuation can be obtained in the attenuation band near the passband on the lower frequency side of the passband.

In the acoustic wave filter device having a balance-to-unbalance transforming function according to the third and fourth preferred embodiments of the present invention, the first and second longitudinally coupled resonator acoustic wave filters are connected in parallel to the unbalanced signal terminal, the third and fourth longitudinally coupled resonator acoustic wave filters are connected in the subsequent stage of the first and second longitudinally coupled resonator acoustic wave filters, and the third and fourth longitudinally coupled resonator acoustic wave filters are connected to the first and second balanced signal terminals. The first and second longitudinally coupled resonator acoustic wave filters or the third and fourth longitudinally coupled resonator acoustic wave filters are withdrawal-weighted. The withdrawal weighting is different between the first and second longitudinally coupled resonator acoustic wave filters or the third and fourth longitudinally coupled resonator acoustic wave filters. Accordingly, the attenuation in the attenuation band near the passband can be controlled without significantly affecting the passband. For example, a sufficient attenuation can be obtained in the attenuation band on the lower frequency side of the passband.

When the withdrawal weighting is performed in an asymmetrical manner with respect to the center of the withdrawal-weighted longitudinally coupled resonator acoustic wave filter in the acoustic wave propagating direction, the attenuation in the attenuation band near the passband can be further increased.

When the number of electrode fingers on which the withdrawal weighting is performed is equal among the withdrawal-weighted longitudinally coupled resonator acoustic wave filters, the attenuation in the attenuation band near the passband can be adjusted by the manner of withdrawal weighting with further preventing an effect on the passband.

When the withdrawal weighting is performed on the corresponding IDTs among the plurality of longitudinally coupled resonator acoustic wave filters, the attenuation in the attenuation band near the passband can be adjusted by the manner of withdrawal weighting with further preventing an effect on the passband.

When all of the IDTs are withdrawal-weighted, an attenuation-frequency characteristic can be adjusted more effectively.

A duplexer according to other preferred embodiments of the present invention includes the acoustic wave filter device according to preferred embodiments of the present invention. Accordingly, a sufficient attenuation can be obtained near the passband without significantly affecting the filter characteristic in the passband. Also, by using the acoustic wave filter device of preferred embodiments of the present invention as at least one of bandpass filters on receiver and transmitter sides, the filter characteristic on the receiver side and/or the transmitter side can be effectively improved.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 7 is a schematic plan view showing an electrode configuration of a SAW filter device according to a fourth preferred embodiment of the present invention.

FIG. 8 is a schematic plan view showing an electrode configuration of a SAW filter device according to a fifth preferred embodiment of the present invention.

FIG. 11 is a schematic plan view illustrating an example of a duplexer configured according to a preferred embodiment of the present invention.

FIG. 12 is a schematic plan view showing an electrode configuration of a SAW filter device according to a known art.

DETAILED DESCRIPTION OF PREFERRED EMBODIMENTS

Hereinafter, the present invention is described by describing specific preferred embodiments of the present invention with reference to the drawings.

Figure 1:
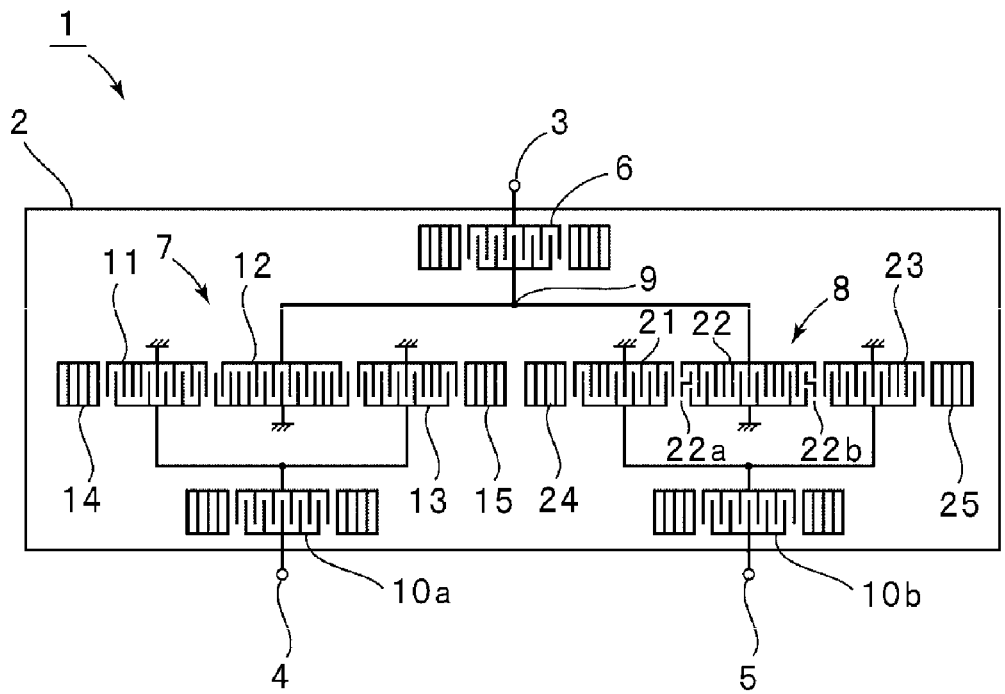
FIG. 1 is a schematic plan view showing an electrode configuration of a SAW filter device according to a first preferred embodiment of the present invention.

FIG. 1 is a schematic plan view showing an electrode configuration of a surface acoustic wave (SAW) filter device 1 according to a first preferred embodiment of the present invention. The SAW filter device 1 includes a piezoelectric substrate 2. In this preferred embodiment, a 42°-rotated Y-cut X-propagating $LiTaO_3$ substrate is preferably used as the piezoelectric substrate 2, for example.

The SAW filter device 1 includes an unbalanced signal terminal 3 as an input terminal, and first and second balanced signal terminals 4 and 5 as output terminals. First and second longitudinally coupled resonator SAW filters 7 and 8 are connected to the unbalanced signal terminal 3 via a one-terminal-pair SAW resonator 6. The first and second longitudinally coupled resonator SAW filters 7 and 8 include first to third interdigital transducers (IDTs) 11 to 13 and 21 to 23 arranged along a SAW propagating direction, and reflectors 14 and 15 and 24 and 25 disposed on both sides of the area where the IDTs 11 to 13 and 21 to 23 are located in the SAW propagating direction. That is, each of the longitudinally coupled resonator SAW filters 7 and 8 is a 3-IDT-type longitudinally coupled resonator SAW filter including three IDTs.

One end of the second IDT 12 in the center of the first longitudinally coupled resonator SAW filter 7 is connected to a common node 9. Also, one end of the IDT 22 in the center of the second longitudinally coupled resonator SAW filter 8 is connected to the common node 9. The common node 9 is connected to the unbalanced signal terminal 3 via the one-terminal-pair SAW resonator 6.

The other ends of the IDTs 12 and 22 are grounded.

Ends of the first and third IDTs 11 and 13 of the first longitudinally coupled resonator SAW filter 7 are grounded, whereas the other ends thereof are connected to a common node, which is connected to the first balanced signal terminal 4 via a one-terminal-pair SAW resonator 10a. Also, ends of the first and third IDTs 21 and 23 of the second longitudinally coupled resonator SAW filter 8 are grounded, whereas the other ends thereof are connected to a common node, which is connected to the second balanced signal terminal 5 via a one-terminal-pair SAW resonator 10b.

The second IDT 12 of the first longitudinally coupled resonator SAW filter 7 and the second IDT 22 of the second longitudinally coupled resonator SAW filter 8 have a phase difference of about 180°. Accordingly, the longitudinally coupled resonator SAW filter device 1 has a balance-to-unbalance transforming function.

In this preferred embodiment, all of the IDTs 11 to 13 and 21 to 23 are withdrawal-weighted. Furthermore, in the second longitudinally coupled resonator SAW filter 8, the central IDT 22 is not only withdrawal-weighted but also series-weighted at both edges in the SAW propagating direction. The series weighting is a weighting method in which, at one edge of the IDT 22, a crank dummy electrode finger 22a is disposed over an area provided with the outermost electrode finger and the next outermost electrode finger. Also, a dummy electrode finger 22b is provided at the other edge of the IDT 22 for series weighting. The series weighting is performed to improve the degree of balance.

In this preferred embodiment, the degree of balance is improved by the above-described series weighting and all of the IDTs 11 to 13 and 21 to 23 are withdrawal-weighted. In addition, the manner of the withdrawal weighting in the IDT 12 is different from that in the IDT 22. Accordingly, an attenuation in the attenuation band near the passband is increased without significantly affecting the filter characteristic in the passband. Those characteristics are described below with reference to a specific experiment.

Note that the electrode configuration shown in the attached drawings including FIG. 1 is simplified, that is, the number of electrode fingers shown in the drawings is less than the actual number.

Figures 2A, 2B, 2C:
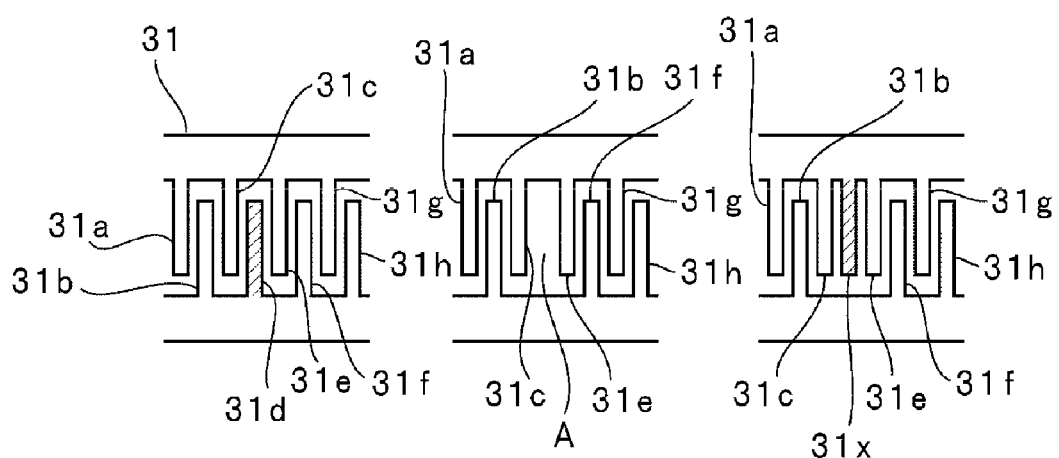
FIGS. 2A to 2C are simplified partial plan views illustrating withdrawal weighting performed according to preferred embodiments of the present invention.

FIGS. 2A to 2C are simplified plan views illustrating withdrawal weighting. That is, as shown in FIG. 2A, an IDT 31 includes a plurality of electrode fingers 31a to 31h. Assume that the hatched electrode finger 31d, the fourth electrode finger from the left in FIG. 2A, is withdrawn. If the electrode finger 31d is withdrawn or removed, a gap A is provided in the portion where the electrode finger 31d existed, as shown in FIG. 2B. In this case, however, the continuity of the electrode fingers is lost. Thus, an electrode finger 31x connected to the same potential is disposed between the third electrode finger 31c and the fifth electrode finger 31e from the left, as shown in FIG. 2C. This is the weighting method called withdrawal weighting. All of the electrode fingers 31c, 31x, and 31e are connected to the same potential, and thus, no SAW is excited among these electrode fingers.

The SAW filter device 1 according to the above-described preferred embodiment was manufactured in accordance with the following specifications.

In this preferred embodiment, a bandpass filter having a balance-to-unbalance transforming function, which is used as a receiving filter of a mobile phone of the WCDMA (wide-band code division multiple access) method, was manufactured. Herein, the impedance on the side of the unbalanced signal terminal 3 is about 50Ω, whereas the impedance on the side of the balanced signal terminals 4 and 5 is about 100Ω. That is, the SAW filter device 1 has a 1:2 impedance converting function.

Each electrode was formed on the above-described piezoelectric substrate in the following manner by using Al alloy as an electrode material.

The longitudinally coupled resonator SAW filter 7 has the following design, assuming that the wavelength defined by the electrode pitch in each IDT is $\lambda I$.

Crossing width of electrode fingers: 44.9 $\lambda I$

The number of electrode fingers in IDTs (in the order of IDTs 11, 12, and 13: 35/49/35

The number of electrode fingers in each of reflectors 14 and 15: 85

Metallization ratio: 0.64

Thickness of electrode film: 0.079 $\lambda I$

Although not shown in FIG. 1, the portion where the IDTs are adjacent to each other is provided with a small-pitched electrode fingers portion, where the pitch of some electrode fingers at the edge of the IDT is less than that of the other electrode fingers. With this configuration, insertion loss is reduced.

The number of electrode fingers in the small-pitched electrode fingers portion is 4 at the edge of the IDT 11 on the IDT 12 side, 4 at the edge of the IDT 12 on the IDT 11 side, 4 at the edge of the IDT 12 on the IDT 13 side, and 4 at the edge of the IDT 13 on the IDT 12 side.

Withdrawal weighting was performed on the following electrode fingers in the IDTs 11 to 13.

IDT 11: sixth electrode finger from the edge on the reflector 14 side

IDT 12: sixth electrode finger from the edge on the IDT 11 side and sixth electrode finger from the edge on the IDT 13 side IDT 13: sixth electrode finger from the edge on the reflector 15 side Since FIG. 1 is simplified, as described above, the positions of the withdrawal-weighted electrode fingers do not match the above-described specifications.

The second longitudinally coupled resonator SAW filter 8 is different from the first longitudinally coupled resonator SAW filter 7 in that the phase of the IDT 22 is inverted with respect to the phase of the IDT 12. Also, the positions of the withdrawal-weighted electrode fingers are different. That is, in the IDT 22, the ninth electrode finger from the edge on the IDT 21 side and the ninth electrode finger from the edge on the IDT 23 side are withdrawal-weighted. As described above, in the IDT 22, both edges are series-weighted. Other than that, the second longitudinally coupled resonator SAW filter 8 has the same configuration as that of the first longitudinally coupled resonator SAW filter 7.

The SAW resonator 6 was manufactured in accordance with the following specifications, assuming that the wavelength defined by the pitch in the IDT is $\lambda I$.

Crossing width: 37.8 $\lambda I$

Figure 3:
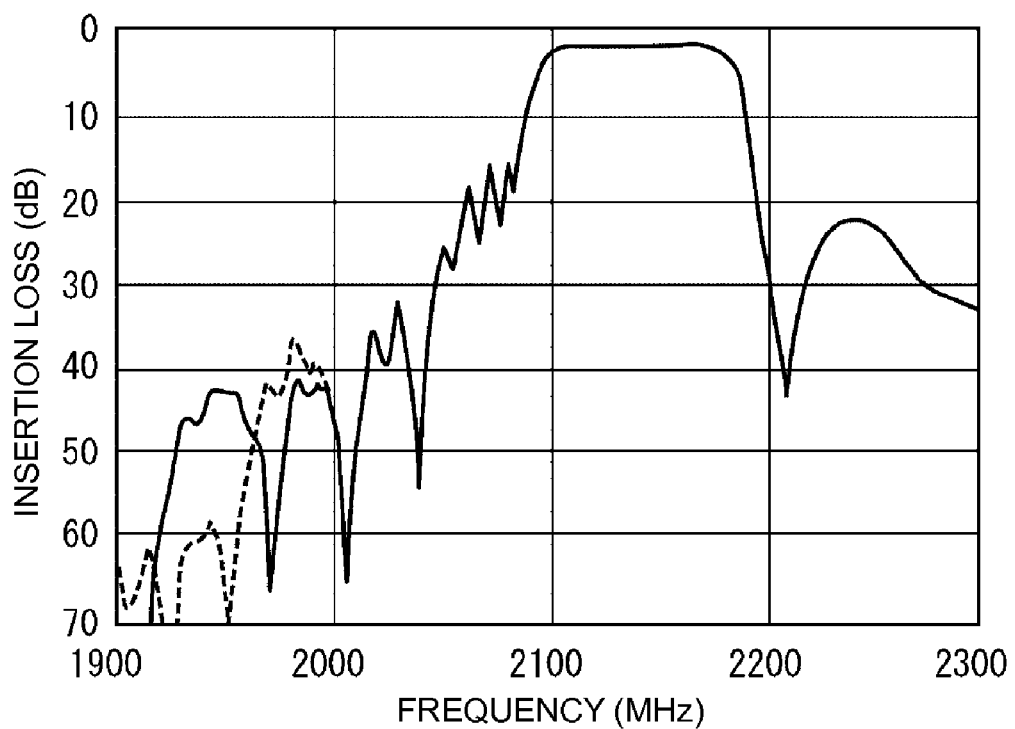
FIG. 3 shows an attenuation-frequency characteristic of SAW filter devices according to a preferred embodiment and a comparative example of the present invention.
Figure 4:
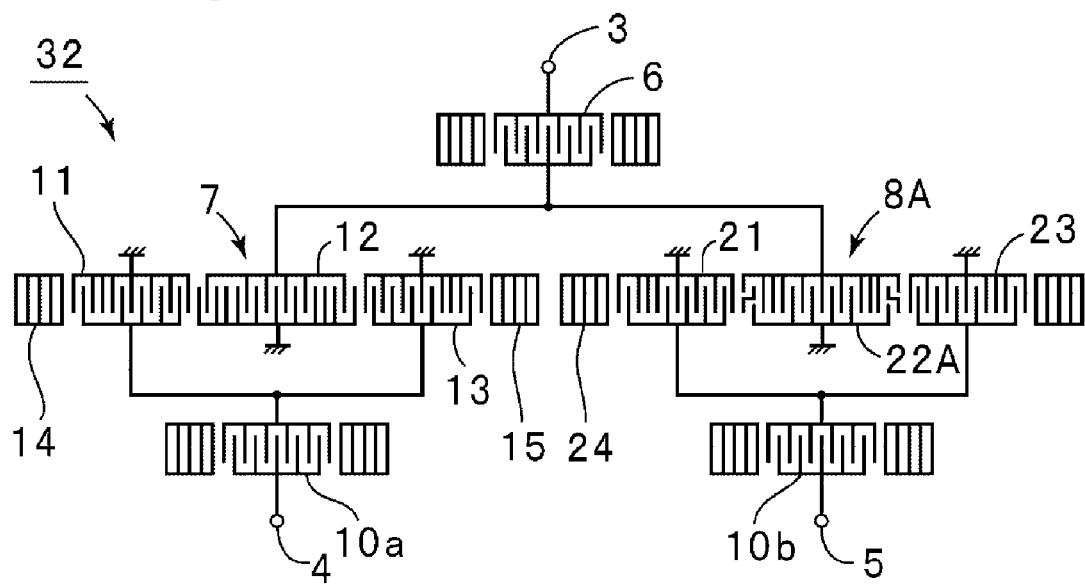
FIG. 4 is a schematic plan view showing an electrode configuration of the SAW filter device according to the comparative example.

The number of electrode fingers in IDT: 161
The number of electrode fingers in each reflector: 15
Metallization ratio: 0.58
Thickness of electrode film: 0.082 λI
The SAW resonators 10a and 10b were designed as follows.
Crossing width: 35.1 λI
The number of electrode fingers in IDT: 161
The number of electrode fingers in each reflector: 15
Metallization ratio: 0.58
Thickness of electrode film: 0.082 λI FIG. 3 shows an attenuation-frequency characteristic of the SAW filter device according to this preferred embodiment manufactured in the above-described manner. FIG. 4 shows a SAW filter device 32 manufactured as a comparative example. The SAW filter device 32 has the same configuration as in the above-described preferred embodiment except that an IDT 22A of a second longitudinally coupled resonator SAW filter 8A is withdrawal-weighted in the same manner as in the IDT 12. In this SAW filter device 32, the attenuation-frequency characteristic was measured. The result is indicated by a broken line in FIG. 3.

As is clear from the comparison between the solid line and the broken line shown in FIG. 3, there is no difference in the frequency characteristic in the passband in the above-described preferred embodiment and the comparative example. In the WCDMA method, the passband in a receiver-side filter of a mobile phone is 2110 MHz to 2170 MHz, whereas the passband in a transmitter-side filter is 1920 MHz to 1980 MHz. Accordingly, the passband in the transmitter-side filter corresponds to the attenuation band in the receiver-side filter. The largest possible attenuation is required in this attenuation band.

As shown in FIG. 3, in the SAW filter device according to the comparative example, the insertion loss is about 37 dB in 1900 to 2000 MHz, in particular, around 1970 MHz near the passband. On the other hand, in the SAW filter device according to the above-described preferred embodiment, the minimum insertion loss is at least about 42 dB or more in the attenuation band near the passband, in particular, in the attenuation band on the low frequency side. The minimum insertion loss in the frequency band of 1900 MHz to 2000 MHz is at least about 42 dB, and the attenuation in the attenuation band near the passband, in particular, in the attenuation band on the low frequency side, is improved by about 5 dB. At this time, the filter characteristic in the passband is not substantially changed.

In this preferred embodiment, the attenuation in the attenuation band near the passband can be increased, that is, the minimum insertion loss in the attenuation band near the passband can be increased for the following reasons.

If the position of the electrode finger to which withdrawal weighting is applied is changed at withdrawal weighting, the frequencies at the peak and valley of a response generated on the lower frequency side of the passband change, but the characteristic of the SAW filter in the passband is not substantially changed. In the configuration in which the two longitudinally coupled resonator SAW filters 7 and 8 are connected in parallel as in the preferred embodiment, if the longitudinally coupled resonator SAW filters 7 and 8 are withdrawal-weighted in the same manner, the above-described frequencies at the peak and valley change. However, the change occurs within only a predetermined range, and the attenuation in a desired attenuation band cannot always be increased.

On the other hand, in this preferred embodiment, the position of the withdrawal weighting in the first longitudinally coupled resonator SAW filter 7 is different from that in the second longitudinally coupled resonator SAW filter 8. Thus, changes of the peak and valley in the parallel-connected first and second longitudinally coupled resonator SAW filters are overlapped. The difference in withdrawal weighting enables a significant extension of the adjustment range of the frequency characteristic in the attenuation band due to the manner of withdrawal weighting. For example, in a frequency range in which a large attenuation is required, the attenuation can be increased by performing withdrawal weighting so that the peak of the response does not exist or by reducing the response. That is, in the above-described preferred embodiment, the position of withdrawal weighting in the IDT 12 is different from that in the IDT 22 so that a large attenuation can be obtained in the attenuation band on the lower frequency side of the passband.

In other words, in this preferred embodiment, the manner of withdrawal weighting in the IDT 12 is different from that in the IDT 22 so that the attenuation in the attenuation band near the passband on the lower frequency side of the passband can be increased.

As described above, by using different manners of withdrawal weighting in the IDTs 12 and 22, the attenuation in the attenuation band on the lower frequency side of the passband can be increased without significantly affecting the filter characteristic in the passband. As described above, even when the different manners of withdrawal weighting are used in the IDTs 12 and 22, the attenuation on the lower frequency side of the passband cannot always be increased. However, by using different manners of withdrawal weighting in the IDTs 12 and 22, the attenuation characteristic in the attenuation band near the passband can be adjusted without significantly affecting the filter characteristic in the passband. Thus, the manner of withdrawal weighting may be changed in accordance with a required attenuation characteristic.

Figure 5:
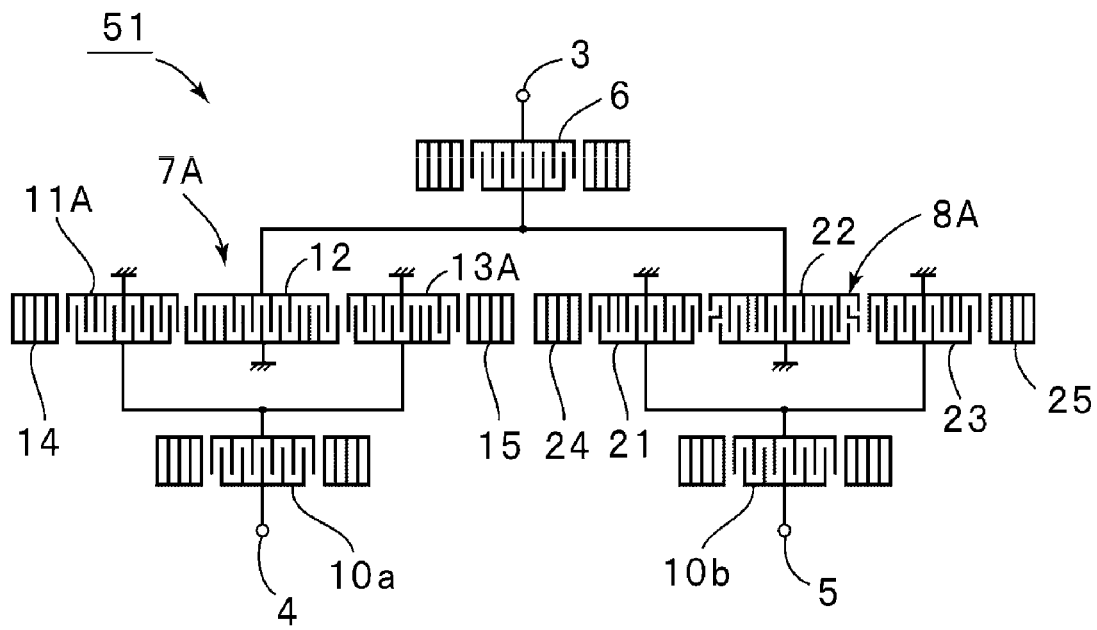
FIG. 5 is a schematic plan view illustrating a SAW filter device according to a second preferred embodiment of the present invention.

FIG. 5 is a schematic plan view showing an electrode configuration of a SAW filter device according to a second preferred embodiment of the present invention. In the SAW filter device 1 shown in FIG. 1, the IDTs 11 to 13 of the longitudinally coupled resonator SAW filter 7 are withdrawal-weighted in a symmetrical manner with respect to the center of the central IDT 12 in the SAW propagating direction. Likewise, the longitudinally coupled resonator SAW filter 8 is withdrawal-weighted in a symmetrical manner with respect to the center of the central IDT 22 in the SAW propagating direction.

On the other hand, in the SAW filter device 51 shown in FIG. 5, IDTs 11A and 13A are withdrawal-weighted in an asymmetrical manner with respect to the center of a central second IDT 12 in the SAW propagating direction in a first longitudinally coupled resonator SAW filter 7A. Likewise, a second longitudinally coupled resonator SAW filter 8A is withdrawal-weighted in an asymmetrical manner with respect to the center of an IDT 22.

Other than the above-described point, the longitudinally coupled resonator SAW filter device 51 has substantially the same configuration as that of the longitudinally coupled resonator SAW filter device 1.

As is clear from the SAW filter device 51 according to the second preferred embodiment of the present invention, the manner of withdrawal weighting in each of the longitudinally coupled resonator SAW filters 7A and 8A need not be symmetrical with respect to the central IDT in the SAW propagating direction, but may be asymmetrical. By allowing the asymmetrical manner, the degree of freedom of design to obtain a further attenuation characteristic is increased, and the attenuation in the attenuation band may be further increased.

FIGS. 1 and 5 illustrate the configuration having a balance-to-unbalance transforming function, in which the two longitudinally coupled resonator SAW filters are connected in parallel to the unbalanced signal terminal. However, the present invention can be applied to a SAW filter device having another electrode configuration. This is described below with reference to FIGS. 6 to 10.

Figure 6:
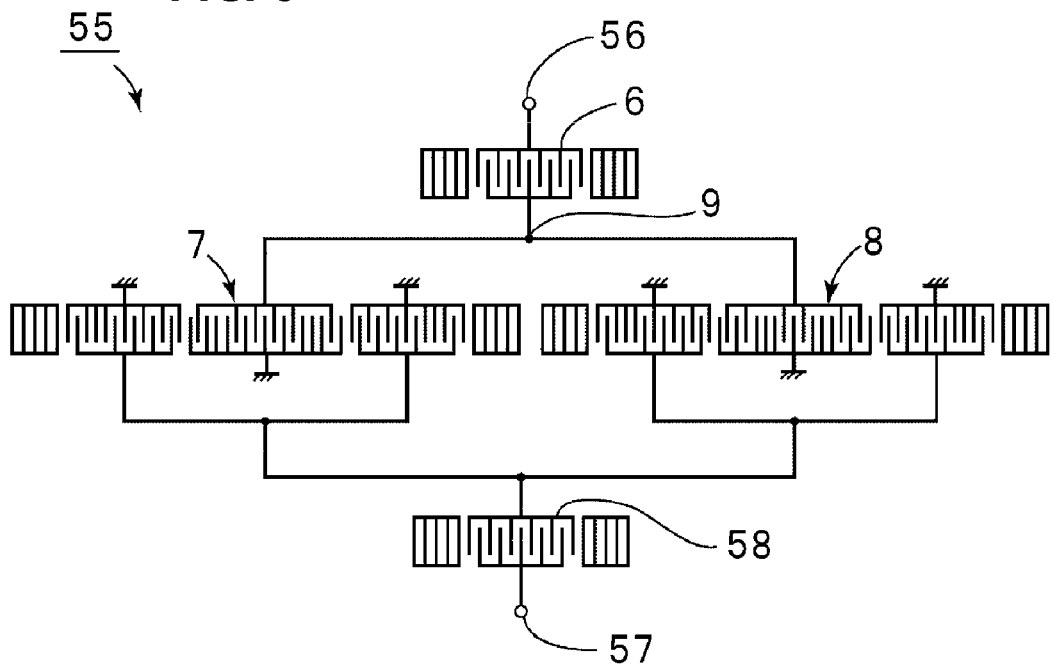
FIG. 6 is a schematic plan view showing an electrode configuration of a SAW filter device according to a third preferred embodiment of the present invention.

FIG. 6 is a schematic plan view showing an electrode configuration of a SAW filter device 55 according to a third preferred embodiment of the present invention. The SAW filter device 55 according to the third preferred embodiment does not include a pair of balanced signal terminals. Instead, the SAW filter device 55 includes a first terminal 56 defining an input terminal and a second terminal 57 defining an output terminal. First and second longitudinally coupled resonator SAW filters 7 and 8 have substantially the same configuration as in the first preferred embodiment except that the phase of the second longitudinally coupled resonator SAW filter is the same as that of the first longitudinally coupled resonator SAW filter. Input terminals of the first and second longitudinally coupled resonator SAW filters 7 and 8 are connected to a common node 9. The common node 9 is connected to the first terminal 56 via a one-terminal-pair SAW resonator 6. Also, output terminals of the longitudinally coupled resonator SAW filters 7 and 8 are connected to a common node, which is connected to the second terminal 57 via a one-terminal-pair SAW resonator 58.

As described above, the SAW filter device 55 has substantially the same configuration as that of the SAW filter device 1 except that a balance-to-unbalance transforming function is not provided and that the output terminals of the first and second longitudinally coupled resonator SAW filters 7 and 8 are connected to the common node, which is connected to the second terminal 57 via the one-terminal-pair SAW resonator 58.

In this preferred embodiment, the longitudinally coupled resonator SAW filter device of parallel connection type that does not have the balance-to-unbalance transforming function is obtained. In this case, similar to SAW filter device 1, the manner of withdrawal weighting in the first longitudinally coupled resonator SAW filter 7 is different from that in the second longitudinally coupled resonator SAW filter 8. Thus, the attenuation in the attenuation band on the lower frequency side of the passband can be adjusted without significantly affecting the filter characteristic in the passband. Furthermore, by using different manners of weighting in both of the filters so that the attenuation in the attenuation band on the lower frequency side of the passband is increased, a sufficient attenuation can be obtained in the attenuation band on the lower frequency side of the passband.

As shown in FIG. 6, the present invention can be applied to a parallel connection type SAW filter device that does not have the balance-to-unbalance transforming function.

FIG. 7 is a schematic plan view showing an electrode configuration of a SAW filter device 61 according to a fourth preferred embodiment of the present invention. The electrode configuration shown in the figure is connected between an unbalanced signal terminal 63 and first and second balanced signal terminals 64 and 65. First and second longitudinally coupled resonator SAW filter units 67 and 68 are connected in parallel to the unbalanced signal terminal 63 via a one-terminal-pair SAW resonator 66. The first longitudinally coupled resonator SAW filter unit 67 is connected to the first balanced signal terminal 64 via a one-terminal-pair SAW resonator 69a. The second longitudinally coupled resonator SAW filter unit 68 is connected to the second balanced signal terminal 65 via a one-terminal-pair SAW resonator 69b.

In this preferred embodiment, the first longitudinally coupled resonator SAW filter unit 67 includes parallel-connected first and second longitudinally coupled resonator SAW filters 67A and 67B, and the second longitudinally coupled resonator SAW filter unit 68 includes parallel-connected first and second longitudinally coupled resonator SAW filters 68A and 68B. That is, this configuration corresponds to the configuration in which each of the longitudinally coupled resonator SAW filters 7 and 8 of the longitudinally coupled resonator SAW filter device 1 according to the first preferred embodiment is replaced by two parallel-connected longitudinally coupled resonator SAW filters.

In this preferred embodiment, similar to the first preferred embodiment, the manner of withdrawal weighting in the first longitudinally coupled resonator SAW filters 67A and 67B is different from that in the second longitudinally coupled resonator SAW filters 68A and 68B, so that the attenuation characteristic in the attenuation band near the passband can be adjusted and the attenuation in the attenuation band can be increased.

In this case, the withdrawal weighting in at least one of the first and second longitudinally coupled resonator SAW filters 67A and 67B of the first longitudinally coupled resonator SAW filter unit 67 may be different from that in the other longitudinally coupled resonator SAW filters.

In the fourth preferred embodiment, similar to the first preferred embodiment, both edges of the central IDT are series-weighted in the longitudinally coupled resonator SAW filters 68A and 68B. This improves the degree of balance.

FIG. 8 is a schematic plan view showing an electrode configuration of a SAW filter device according to a fifth preferred embodiment. In the SAW filter device 1000 according to the fifth preferred embodiment, the electrode configuration shown in the figure is connected between an unbalanced signal terminal 3 and first and second balanced signal terminals 4 and 5. First and second longitudinally coupled resonator SAW filter units 1001 and 1002 are connected in parallel to the unbalanced signal terminal 3 via a one-terminal-pair SAW resonator 6. In the first and second longitudinally coupled resonator SAW filter units 1001 and 1002, a side of each of central IDTs 1012 and 1022 includes IDT units 1012a and 1012b and IDT units 1022a and 1022b, respectively. The IDT units 1012a and 1022a are connected to the balanced signal terminal 4, whereas the IDT units 1012b and 1022b are connected to the balanced signal terminal 5.

In this preferred embodiment, similar to the first preferred embodiment, the manner of withdrawal weighting in the first longitudinally coupled resonator SAW filter 1001 is different from that in the second longitudinally coupled resonator SAW filter 1002, so that the attenuation characteristic in the attenuation band near the passband can be adjusted and the attenuation in the attenuation band can be increased.

Figure 9:
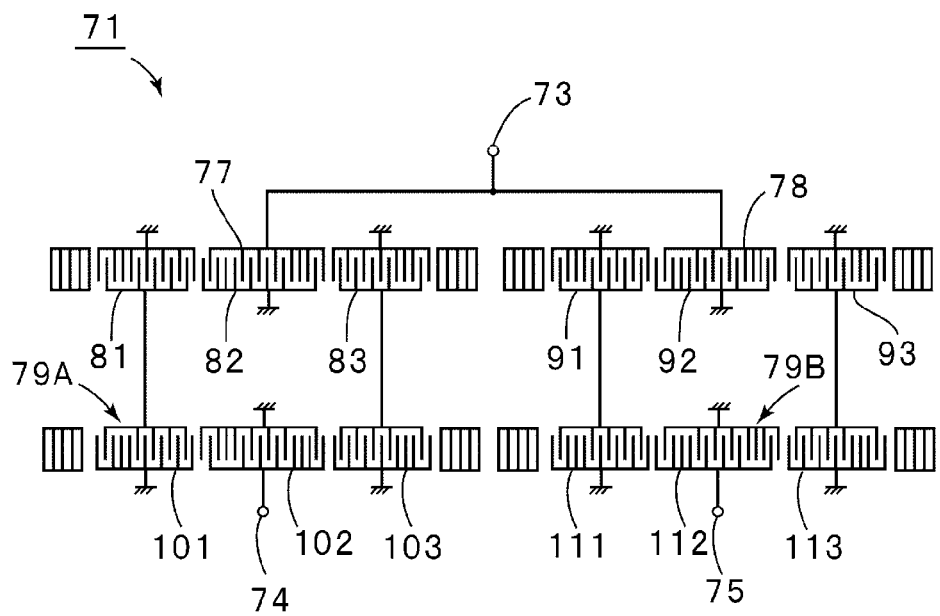
FIG. 9 is a schematic plan view showing an electrode configuration of a SAW filter device according to a sixth preferred embodiment of the present invention.

FIG. 9 is a schematic plan view showing an electrode configuration of a SAW filter device according to a sixth preferred embodiment. In the SAW filter device 71 according to the sixth preferred embodiment, the electrode configuration shown in the figure is connected between an unbalanced signal terminal 73 and first and second balanced signal terminals 74 and 75. Herein, first and second longitudinally coupled resonator SAW filters 77 and 78 are connected in parallel to the unbalanced signal terminal 73. Each of the first and second longitudinally coupled resonator SAW filters 77 and 78 is a 3-IDT-type longitudinally coupled resonator SAW filter including IDTs 81 to 83 or 91 to 93 arranged along the SAW propagating direction.

An end of each of the central IDTs 82 and 92 is connected to a common node, which is connected to the unbalanced signal terminal 73. The other ends of the IDTs 82 and 92 are grounded. An end of each of the IDTs 81 and 83 is grounded, and the other ends thereof are connected to a third longitudinally coupled resonator SAW filter 79A (described below). Likewise, an end of each of the IDTs 91 and 93 is grounded, and the other ends thereof are connected to a fourth longitudinally coupled resonator SAW filter 79B (described below).

Each of the third and fourth longitudinally coupled resonator SAW filters 79A and 79B is a 3-IDT-type longitudinally coupled resonator SAW filter including IDTs 101 to 103 or 111 to 113 arranged along the SAW propagating direction. An end of each of the IDTs 101 and 103 is connected to the other ends of the IDTs 81 and 83, respectively, so that the input terminal of the third longitudinally coupled resonator SAW filter 79A is connected to the output terminal of the first longitudinally coupled resonator SAW filter 77. The other ends of the IDTs 101 and 103 are grounded. An end of the IDT 102 is grounded and the other end thereof is connected to the first balanced signal terminal 74.

Likewise, in the fourth longitudinally coupled resonator SAW filter 79B, the other ends of the IDTs 111 and 113 are grounded. An ends of each of the IDTs 111 and 113 is connected to the IDTs 91 and 93, respectively. That is, the input terminal of the fourth longitudinally coupled resonator SAW filter 79B is connected to the output terminal of the second longitudinally coupled resonator SAW filter 78. One end of the IDT 112 is grounded, and the other end thereof is connected to the second balanced signal terminal 75.

In the SAW filter device 71 according to the sixth preferred embodiment, all of the IDTs 81 to 83, 91 to 93, 101 to 103, and 111 to 113 are withdrawal-weighted. According to preferred embodiments of the present invention, the withdrawal weighting in the IDT 82 is different from that in the IDT 92. That is, the withdrawal weighting in one of the IDTs is different from that in the other IDTs. In other words, the withdrawal weighting in at least the longitudinally coupled resonator SAW filter 77 is different from that in the other SAW filters 78, 79A, and 79B. Accordingly, as in the first preferred embodiment, the attenuation in the attenuation band near the passband can be adjusted without significantly affecting the filter characteristic in the passband by using different manners of withdrawal weighting.

Figure 10:
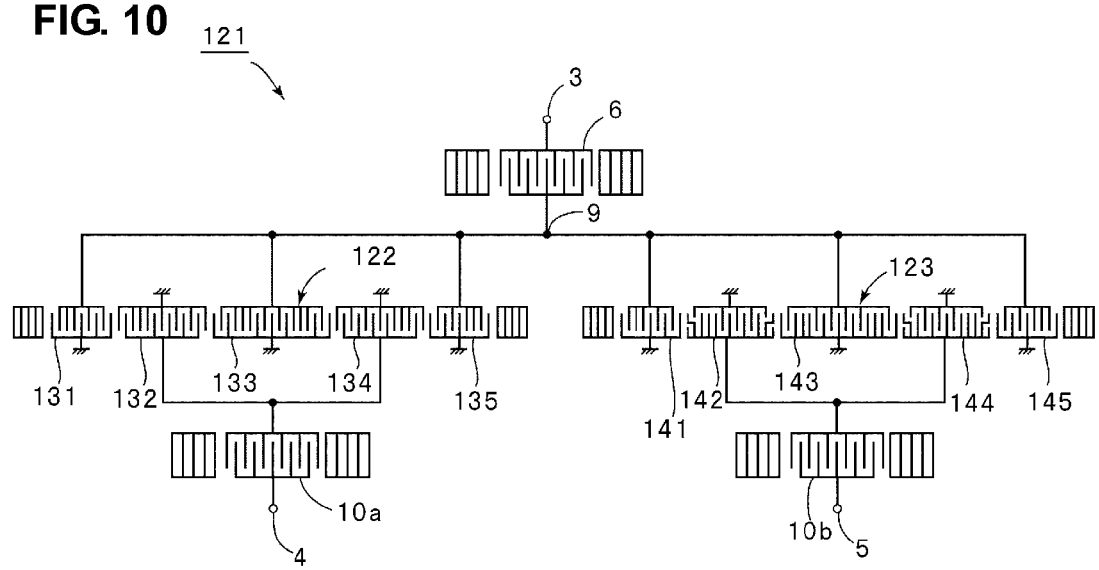
FIG. 10 is a schematic plan view showing an electrode configuration of a SAW filter device according to a modification of preferred embodiments of the present invention.

FIG. 10 is a schematic plan view showing an electrode configuration if a SAW filter device according to a modification of preferred embodiments of the present invention. The SAW filter device 121 according to the modification has the same configuration as that according to the first preferred embodiment except that first and second longitudinally coupled resonator SAW filters 122 and 123 of 5-IDT-type are used instead of the first and second longitudinally coupled resonator SAW filters 7 and 8. Thus, the same parts are denoted by the same reference numerals and the corresponding description is omitted.

Each of the first and second longitudinally coupled resonator SAW filters 122 and 123 includes first to fifth IDTs 131 to 135 or 141 to 145 arranged along the SAW propagating direction. Herein, the withdrawal weighting in the IDTs 131 to 135 is different from that in the IDTs 141 to 145. With this configuration, as in the first preferred embodiment, the attenuation in the attenuation band near the passband can be adjusted without significantly affecting the filter characteristic. In the present invention, 5-IDT-type longitudinally coupled resonator SAW filters may be used instead of 3-IDT-type longitudinally coupled resonator SAW filters. Furthermore, the present invention can be applied to longitudinally coupled resonator SAW filters of 2-IDT-type or having another number of IDTs.

FIG. 11 is a schematic plan view showing an electrode configuration of a duplexer according to another preferred embodiment of the present invention. The duplexer 201 has the electrode configuration shown in the figure provided on a piezoelectric substrate (not shown). Herein, the longitudinally coupled resonator SAW filter device 1 according to the first preferred embodiment and a transmitter-side filter 202 are provided. The longitudinally coupled resonator SAW filter device 1 according to the first preferred embodiment is connected to an unbalanced signal terminal 3, so that a receiver-side filter is provided. On the other hand, the longitudinally coupled resonator SAW filter 202 having a ladder circuit configuration, defining a transmitter-side filter, is connected to the unbalanced signal terminal 3. The transmitter-side filter 202 includes series arm resonators S1, S2, and S3 is connected to a series arm extending between the unbalanced signal terminal 3 and an output terminal 203, and parallel arm resonators P1 and P2. Each of the series arm resonators S1 to S3 and the parallel arm resonators P1 and P2 includes a one-terminal-pair SAW resonator.

In the duplexer 201, including the longitudinally coupled resonator SAW filter device 1 as the receiver-side bandpass filter and the longitudinally coupled resonator SAW filter 202 of a ladder circuit configuration as the transmitter-side filter, the attenuation in the attenuation band on the lower frequency side of the passband of the longitudinally coupled resonator SAW filter device 1 as the receiver-side bandpass filter, that is, in the passband of the transmitter-side filter, can be increased. Accordingly, an isolation characteristic can be improved.

In various preferred embodiments of the present invention, boundary acoustic waves may be used, in addition to surface acoustic waves. That is, the present invention can be applied not only to the SAW filter device, but also a boundary acoustic wave filter device.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An acoustic wave filter device comprising:
a piezoelectric substrate; and
a plurality of longitudinally coupled resonator acoustic wave filters provided on the piezoelectric substrate; wherein
each of the plurality of longitudinally coupled resonator acoustic wave filters includes an input terminal, an output terminal, an IDT connected to the input terminal, and an IDT connected to the output terminal, the IDT connected to the input terminal and the IDT connected to the output terminal being alternately arranged along an acoustic wave propagating direction;
the acoustic wave filter device further comprising:
a first terminal connected to the input terminals of the plurality of longitudinally coupled resonator acoustic wave filters; and
a second terminal connected to the output terminals of the plurality of longitudinally coupled resonator acoustic wave filters; wherein
the plurality of longitudinally coupled resonator acoustic wave filters are withdrawal-weighted, and the withdrawal weighting in at least one of the plurality of longitudinally coupled resonator acoustic wave filters is different from the withdrawal weighting in another of the plurality of longitudinally coupled resonator acoustic wave filters.

2. The acoustic wave filter device according to claim 1, wherein the withdrawal weighting is asymmetrical with respect to a center of the withdrawal-weighted plurality of longitudinally coupled resonator acoustic wave filter in the acoustic wave propagating direction.

3. The acoustic wave filter device according to claim 1, wherein the number of electrode fingers which are withdrawal weighted is equal among the withdrawal-weighted plurality of longitudinally coupled resonator acoustic wave filters.

4. The acoustic wave filter device according to claim 1, wherein the withdrawal weighting is performed on the corresponding IDTs among the plurality of longitudinally coupled resonator acoustic wave filters.

5. The acoustic wave filter device according to claim 1, wherein all of the IDTs are withdrawal-weighted.

6. A duplexer comprising the acoustic wave filter device according to claim 1.

7. An acoustic wave filter device comprising:
a piezoelectric substrate;
at least one first longitudinally coupled resonator acoustic wave filter; and
at least one second longitudinally coupled resonator acoustic wave filter; wherein
the first longitudinally coupled resonator acoustic wave filter includes an input terminal, an output terminal, an IDT connected to the input terminal, and an IDT connected to the output terminal;
on the piezoelectric substrate, the IDT of the first longitudinally coupled resonator acoustic wave filter connected to the input terminal and the IDT of the first longitudinally coupled resonator acoustic wave filter connected to the output terminal are alternately arranged along an acoustic wave propagating direction, and the output terminal or the input terminal of the first longitudinally coupled resonator acoustic wave filter is connected to a first balanced signal terminal;
the second longitudinally coupled resonator acoustic wave filter includes an input terminal, an output terminal, an IDT connected to the input terminal, and an IDT connected to the output terminal;
on the piezoelectric substrate, the IDT of the second longitudinally coupled resonator acoustic wave filter connected to the input terminal and the IDT of the second longitudinally coupled resonator acoustic wave filter connected to the output terminal are alternately arranged along the acoustic wave propagating direction, the output terminal or the input terminal of the second longitudinally coupled resonator acoustic wave filter is connected to a second balanced signal terminal, and the phase of the second longitudinally coupled resonator acoustic wave filter is different by 180° from the phase of the first longitudinally coupled resonator acoustic wave filter;
the input terminals or the output terminals of the first and second longitudinally coupled resonator acoustic wave filters are connected to an unbalanced signal terminal; and
wherein the first and second longitudinally coupled resonator acoustic wave filters are withdrawal-weighted, and the withdrawal weighting in at least one of the first and second longitudinally coupled resonator acoustic wave filters is different from the withdrawal weighting in the other longitudinally coupled resonator acoustic wave filter.

8. The acoustic wave filter device according to claim 7, wherein the withdrawal weighting is asymmetrical with respect to a center of the first and second withdrawal-weighted longitudinally coupled resonator acoustic wave filter in the acoustic wave propagating direction.

9. The acoustic wave filter device according to claim 7, wherein the number of electrode fingers which are withdrawal weighted is equal among the first and second withdrawal-weighted longitudinally coupled resonator acoustic wave filters.

10. The acoustic wave filter device according to claim 7, wherein the withdrawal weighting is performed on the corresponding IDTs among the first and second longitudinally coupled resonator acoustic wave filters.

11. The acoustic wave filter device according to claim 7, wherein all of the IDTs are withdrawal-weighted.

12. A duplexer comprising the acoustic wave filter device according to claim 7.

13. An acoustic wave filter device comprising:
a piezoelectric substrate; and
first to fourth longitudinally coupled resonator acoustic wave filters, an unbalanced signal terminal, and first and second balanced signal terminals, provided on the piezoelectric substrate; wherein
each of the first to fourth longitudinally coupled resonator acoustic wave filters is provided on the piezoelectric substrate and includes a first IDT connected to one of an input terminal and an output terminal of the corresponding one of the first to fourth longitudinally coupled resonator acoustic wave filters and second IDTs provided on both sides of the first IDT in an acoustic wave propagating direction and connected to the other of the input terminal and the output terminal;
the input terminals of the first and second longitudinally coupled resonator acoustic wave filters are connected to the unbalanced signal terminal, the output terminal of the third longitudinally coupled resonator acoustic wave filter is connected to the first balanced signal terminal, and the output terminal of the fourth longitudinally coupled resonator acoustic wave filter is connected to the second balanced signal terminal;
the output terminal of the first longitudinally coupled resonator acoustic wave filter is connected to the input terminal of the third longitudinally coupled resonator acoustic wave filter, and the output terminal of the second longitudinally coupled resonator acoustic wave filter is connected to the input terminal of the fourth longitudinally coupled resonator acoustic wave filter;
the phase of one of the first to fourth longitudinally coupled resonator acoustic wave filters is inverted with respect to the phases of the other longitudinally coupled resonator acoustic wave filters; and
the first and second longitudinally coupled resonator acoustic wave filters are withdrawal-weighted, and the withdrawal weighting in the first longitudinally coupled resonator acoustic wave filter is different from the withdrawal weighting in the second longitudinally coupled resonator acoustic wave filter.

14. The acoustic wave filter device according to claim 13, wherein the withdrawal weighting is asymmetrical with respect to a center of the first and second withdrawal-weighted longitudinally coupled resonator acoustic wave filter in the acoustic wave propagating direction.

15. The acoustic wave filter device according to claim 13, wherein the number of electrode fingers which are withdrawal weighted is equal among the first and second withdrawal-weighted longitudinally coupled resonator acoustic wave filters.

16. The acoustic wave filter device according to claim 13, wherein the withdrawal weighting is performed on the corresponding IDTs among the first and second longitudinally coupled resonator acoustic wave filters.

17. The acoustic wave filter device according to claim 13, wherein all of the IDTs are withdrawal-weighted.

18. A duplexer comprising the acoustic wave filter device according to claim 13.

19. An acoustic wave filter device comprising:
a piezoelectric substrate; and
first to fourth longitudinally coupled resonator acoustic wave filters, an unbalanced signal terminal, and first and second balanced signal terminals, provided on the piezoelectric substrate; wherein
each of the first to fourth longitudinally coupled resonator acoustic wave filters is provided on the piezoelectric substrate and includes a first IDT connected to one of an input terminal and an output terminal of the corresponding one of the first to fourth longitudinally coupled resonator acoustic wave filters and second IDTs provided on both sides of the first IDT in an acoustic wave propagating direction and connected to the other of the input terminal and the output terminal;
the input terminals of the first and second longitudinally coupled resonator acoustic wave filters are connected to the unbalanced signal terminal, the output terminal of the third longitudinally coupled resonator acoustic wave filter is connected to the first balanced signal terminal, and the output terminal of the fourth longitudinally coupled resonator acoustic wave filter is connected to the second balanced signal terminal;
the output terminal of the first longitudinally coupled resonator acoustic wave filter is connected to the input terminal of the third longitudinally coupled resonator acoustic wave filter, and the output terminal of the second longitudinally coupled resonator acoustic wave filter is connected to the input terminal of the fourth longitudinally coupled resonator acoustic wave filter;

the phase of one of the first to fourth longitudinally coupled resonator acoustic wave filters is inverted with respect to the phases of the other longitudinally coupled resonator acoustic wave filters; and the third and fourth longitudinally coupled resonator acoustic wave filters are withdrawal-weighted, and the withdrawal weighting in the third longitudinally coupled resonator acoustic wave filter is different from the withdrawal weighting in the fourth longitudinally coupled resonator acoustic wave filter.

20. The acoustic wave filter device according to claim 19, wherein the withdrawal weighting is asymmetrical manner with respect to a center of the third and fourth withdrawal-weighted longitudinally coupled resonator acoustic wave filter in the acoustic wave propagating direction.

21. The acoustic wave filter device according to claim 19, wherein the number of electrode fingers which are withdrawal weighted is equal among the third and fourth withdrawal-weighted longitudinally coupled resonator acoustic wave filters.

22. The acoustic wave filter device according to claim 19, wherein the withdrawal weighting is performed on the corresponding IDTs among the third and fourth longitudinally coupled resonator acoustic wave filters.

23. The acoustic wave filter device according to claim 19, wherein all of the IDTs are withdrawal-weighted.

24. A duplexer comprising the acoustic wave filter device according to claim 19.

* * * * *